US012727396B2

(12) United States Patent
Cohen et al.

(10) Patent No.: US 12,727,396 B2
(45) Date of Patent: Sep. 1, 2026

(54) SPIKE-TIMING-DEPENDENT PLASTICITY USING INVERSE RESISTIVITY PHASE-CHANGE MATERIAL

(71) Applicant: International Business Machines Corporation, Armonk, NY (US)

(72) Inventors: Guy M. Cohen, Ossining, NY (US); Takashi Ando, Eastchester, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 1124 days.

(21) Appl. No.: 17/394,544

(22) Filed: Aug. 5, 2021

(65) Prior Publication Data

US 2023/0040983 A1 Feb. 9, 2023

(51) Int. Cl.
*H10N 70/20* (2023.01)
*G06N 3/049* (2023.01)
(Continued)

(52) U.S. Cl.
CPC ........... *H10N 70/231* (2023.02); *G06N 3/049* (2013.01); *G06N 3/065* (2023.01);
(Continued)

(58) Field of Classification Search
CPC ............... H10N 70/231; H10N 70/826; H10N 70/8413; H10N 70/8828; H10N 70/823;
(Continued)

(56) References Cited

U.S. PATENT DOCUMENTS 7,405,964 B2 7/2008 Philipp et al.
7,696,018 B2 * 4/2010 Oliva .................. H10N 70/253 438/102

(Continued)

FOREIGN PATENT DOCUMENTS

KR 101056842 B1 8/2011
WO 2007/030483 A2 3/2007
WO 2023/011885 A1 2/2023

OTHER PUBLICATIONS

International Searching Authority, "Notification of Transmittal of the International Search Report and the Written Opinion of the International Searching Authority, or Declaration," Patent Cooperation Treaty Nov. 22, 2022, 13 pages, International Application No. PCT/EP2022/069805.

(Continued)

*Primary Examiner* — Jerome Leboeuf
(74) *Attorney, Agent, or Firm* — Kimberly Zillig; Ryan, Mason & Lewis, LLP

(57) ABSTRACT

A device for implementing spike-timing-dependent plasticity is provided. The device includes a phase-change element, first and second electrodes disposed respective first and second surfaces of the phase-change element. The phase-change element includes a phase-change material with an inverse resistivity characteristic. The first electrode includes a first heater element, and a first electrical insulating layer which electrically insulates the first resistive heater element from the first electrode and the phase-change element. The second electrode includes a second resistive heater element, and a second electrical insulating layer which electrically insulates the second resistive heater element from the second electrode and the phase-change element.

20 Claims, 11 Drawing Sheets

(51) Int. Cl.
*G06N 3/065* (2023.01)
*G11C 13/00* (2006.01)
*H10N 70/00* (2023.01)

(52) U.S. Cl.
CPC ........ *G11C 13/0004* (2013.01); *G11C 13/004* (2013.01); *G11C 13/0069* (2013.01); *H10N 70/826* (2023.02); *H10N 70/8413* (2023.02); *H10N 70/8828* (2023.02); *G11C 2013/0045* (2013.01)

(58) Field of Classification Search
CPC .... H10N 70/8613; G06N 3/049; G06N 3/065; G06N 3/04; G06N 3/088; G11C 13/0004; G11C 13/004; G11C 13/0069; G11C 2013/0045; G11C 2013/008; G11C 11/54
See application file for complete search history.

(56) References Cited

U.S. PATENT DOCUMENTS

| | | | | |
|---|---|---|---|---|
| 7,796,425 | B2 | 9/2010 | Choi et al. | |
| 8,416,617 | B2 | 4/2013 | Choi et al. | |
| 8,447,714 | B2 | 5/2013 | Breitwisch et al. | |
| 8,526,223 | B2 | 9/2013 | Kim et al. | |
| 8,682,822 | B2 | 3/2014 | Modha et al. | |
| 9,087,302 | B2 | 7/2015 | Sim et al. | |
| 9,466,364 | B1 | 10/2016 | Papandreou et al. | |
| 9,710,747 | B2 | 7/2017 | Kang et al. | |
| 10,283,198 | B2 | 5/2019 | Tortorelli et al. | |
| 2007/0235784 | A1* | 10/2007 | Krusin-Elbaum ... | H10N 70/231 257/296 |
| 2014/0264230 | A1* | 9/2014 | Borodulin ............ | H10N 70/026 257/4 |
| 2018/0174041 | A1 | 6/2018 | Imam et al. | |
| 2021/0210683 | A1 | 7/2021 | Wu et al. | |
| 2021/0376233 | A1* | 12/2021 | Song .................... | H10B 63/845 |
| 2022/0344584 | A1* | 10/2022 | Cheng ................ | H10N 70/8828 |

OTHER PUBLICATIONS

P. Mell et al., "The NIST Definition of Cloud Computing," Recommendations of the National Institute of Standards and Technology, Special Publication 800-145, Sep. 2011, 7 pages.

* cited by examiner $t = t_0$ $t = t_1$ $t = t_2$ $t = t_3$ $t = t_0$ $t = t_1$ $t = t_2$ $t = t_3$ t = $t_0$
130-1
120-1
110
120-2
130-2 t = $t_1$
130-1
120-1
$P_{prog}$
110
111
120-2
130-2 t = $t_2$
130-1
120-1
111
113
110
112
120-2
$P_{prog}$
130-2 t = $t_3$
130-1
120-1
111
113
110
112
120-2
130-2

CORRELATION DETECTION SYSTEM
900

FIG. 10

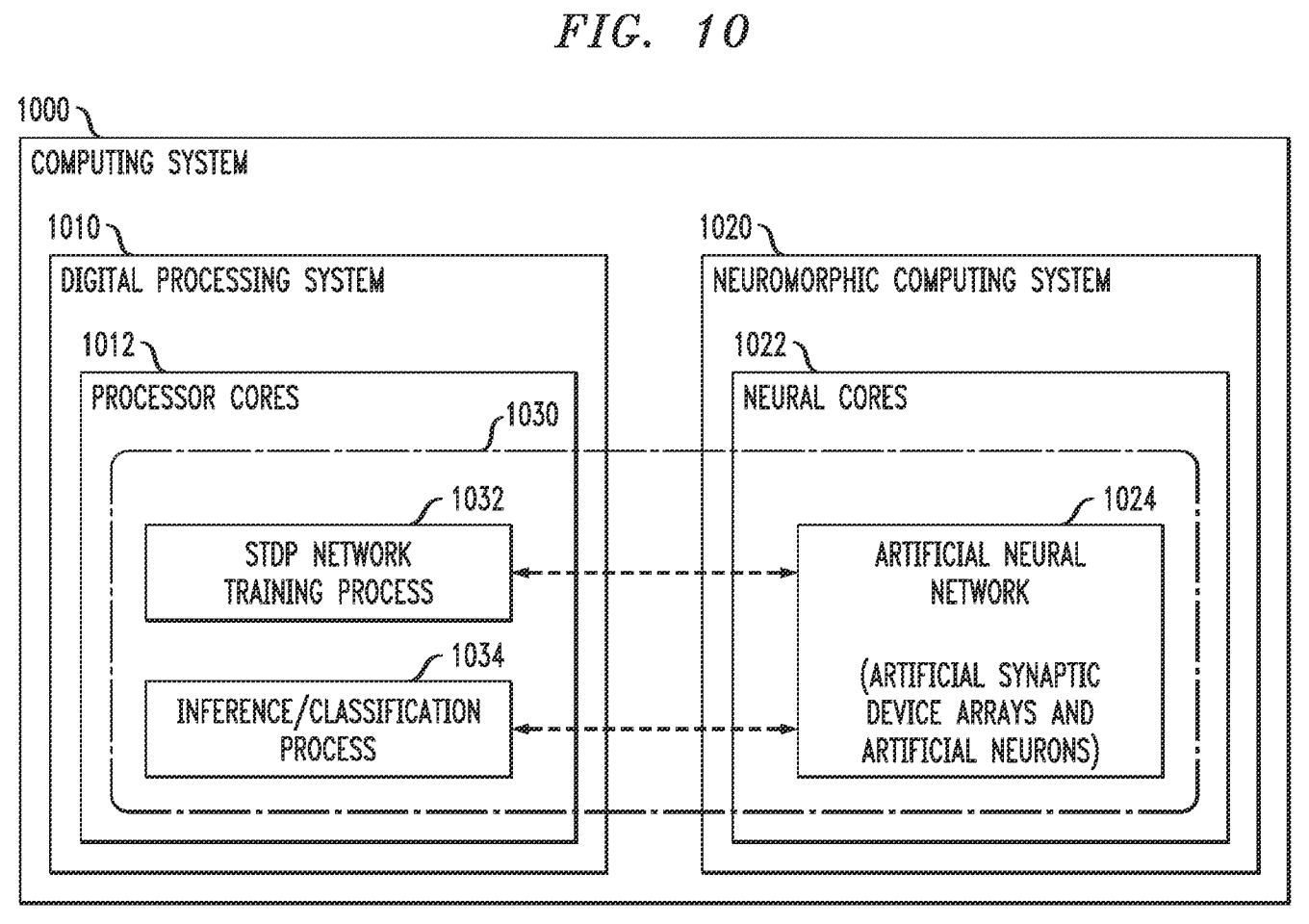

1000 COMPUTING SYSTEM

1010 DIGITAL PROCESSING SYSTEM

1012 PROCESSOR CORES

1030

1032 STDP NETWORK TRAINING PROCESS

1034 INFERENCE/CLASSIFICATION PROCESS

1020 NEUROMORPHIC COMPUTING SYSTEM

1022 NEURAL CORES

1024 ARTIFICIAL NEURAL NETWORK (ARTIFICIAL SYNAPTIC DEVICE ARRAYS AND ARTIFICIAL NEURONS)

Figure 11:
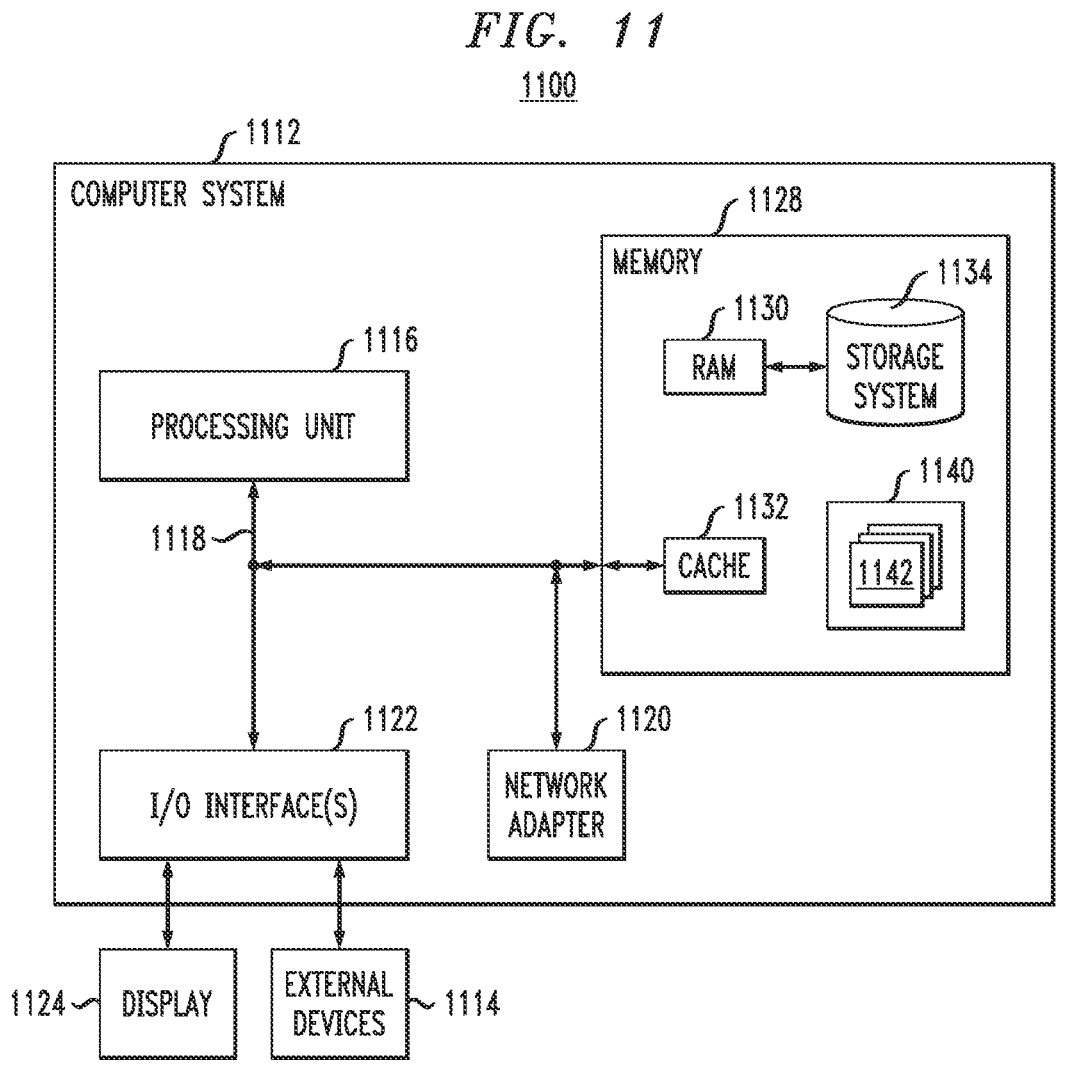

COMPUTER SYSTEM
1112
MEMORY
1128
RAM
1130
STORAGE SYSTEM
1134
PROCESSING UNIT
1116
1118
CACHE
1132
1140
1142
I/O INTERFACE(S)
1122
NETWORK ADAPTER
1120
DISPLAY
1124
EXTERNAL DEVICES
1114

SPIKE-TIMING-DEPENDENT PLASTICITY USING INVERSE RESISTIVITY PHASE-CHANGE MATERIAL

BACKGROUND

This disclosure relates generally to techniques for implementing spike-timing-dependent plasticity for neuromorphic computing and, in particular, utilizing phase-change material devices to implement spike-timing-dependent plasticity computing systems. Information processing systems such as neuromorphic computing systems and artificial neural network systems are utilized in various applications such as machine learning and inference processing for cognitive recognition and computing. Such systems are hardware-based systems that generally include a large number of highly interconnected processing elements (referred to as "artificial neurons") which operate in parallel to perform various types of computations. The artificial neurons (e.g., pre-synaptic neurons and post-synaptic neurons) are connected using artificial synaptic devices which provide synaptic weights that represent connection strengths between the artificial neurons.

As is known in the art, spike-timing-dependent plasticity (STDP) is a biological process which adjusts the strength of connections between neurons in the brain based on the relative timing of a particular neuron's output and input action potentials (referred to as spikes). In a neuromorphic network comprising artificial neurons that are interconnected via programmable artificial synapses, the synaptic conductance changes with time as a function of the relative spike times of pre-synaptic and post-synaptic neurons as per STDP. The change in synapse conductance depends on a precise delay between the firing events at the corresponding post-synaptic and pre-synaptic neurons. The longer the delay, the less the magnitude of synaptic conductance changes. STDP learning techniques can be utilized to train forward-connected artificial neural networks for applications such as pattern recognition.

SUMMARY

Exemplary embodiments of the disclosure include phase-change material devices with inverse resistivity phase-change material for implementing spike-timing-dependent plasticity computing systems. In an exemplary embodiment, a device comprises a phase-change element, a first electrode disposed on a first surface of the phase-change element, and a second electrode disposed on a second surface of the phase-change element. The phase-change element comprises a phase-change material which comprises an inverse resistivity characteristic. The first electrode comprises a first resistive heater element, and a first electrical insulating layer which electrically insulates the first resistive heater element from the first electrode and the phase-change element. The second electrode comprises a second resistive heater element, and a second electrical insulating layer which electrically insulates the second resistive heater element from the second electrode and the phase-change element.

Other embodiments will be described in the following detailed description of exemplary embodiments, which is to be read in conjunction with the accompanying figures.

BRIEF DESCRIPTION OF THE DRAWINGS

FIG. 10 schematically illustrates a system which implements inverse resistivity phase-change material devices for neuromorphic computing, according to an exemplary embodiment of the disclosure.

FIG. 11 schematically illustrates an exemplary architecture of a computing node which can host the system of FIG. 10, according to an exemplary embodiment of the disclosure.

DETAILED DESCRIPTION

Embodiments of the disclosure will now be described in further detail with regard to inverse resistivity phase-change material (PCM) devices for implementing spike-timing-dependent plasticity event correlation and neuromorphic computing systems. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Figure 1A:
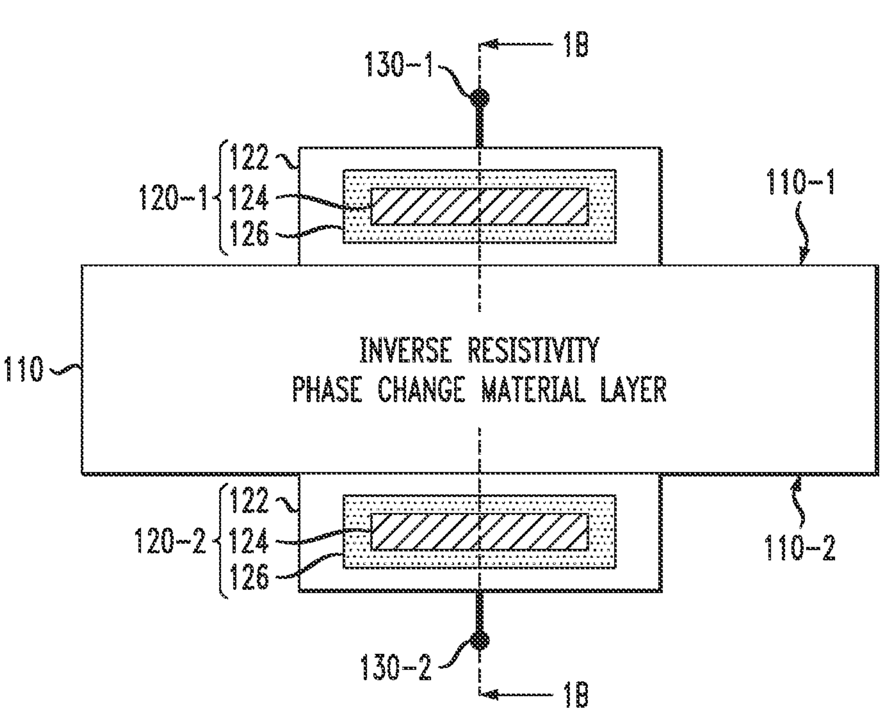
FIGS. 1A and 1B schematically illustrate a correlator device comprising inverse resistivity phase-change material for spike-timing-dependent plasticity, according to an exemplary embodiment of the disclosure.
Figure 1B:
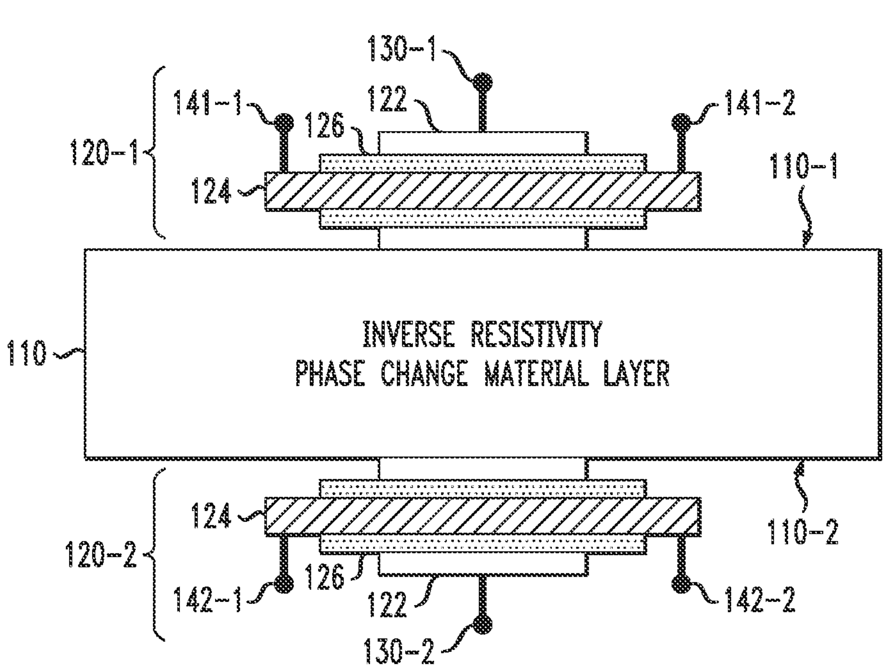

FIGS. 1A and 1B schematically illustrate a correlator device comprising inverse resistivity phase-change material for spike-timing-dependent plasticity, according to an exemplary embodiment of the disclosure. More specifically, FIG. 1A is a schematic cross-sectional view of a correlator device 100, and FIG. 1B is a schematic cross-sectional view of the correlator device 100 along line 1B-1B in FIG. 1A. As shown in FIGS. 1A and 1B, the correlator device 100 comprises a phase-change element 110, a first electrode 120-1 disposed on a first surface 110-1 of the phase-change element 110, and a second electrode 120-2 disposed on a second surface 110-2 of the phase-change element 110. In some embodiments as shown in FIGS. 1A and 1B, the first and second surfaces 110-1 and 110-2 of the phase-change element 110 comprise opposite parallel surfaces of the phase-change element 110, and the first and second electrodes 120-1 and 120-2 (collectively, electrodes 120) have a same geometric footprint and are disposed in alignment to each other on the opposite parallel surfaces of the phase-change element 110.

In some embodiments, the correlator device 100 comprises an inverse resistivity PCM device wherein the phase-change element 110 comprises a phase-change material having inverse resistivity characteristics in which a portion of the phase-change material in an amorphous phase has an electrical conductivity which is greater than the electrical conductivity of a portion of the phase-change material in a crystalline phase. This is in contrast to conventional PCM devices which exhibit a change in the electrical resistance of a phase-change material between a high-resistance amorphous state and a low-resistance crystalline state. In the exemplary embodiments described herein, the inverse resistivity PCM devices exhibit a high-resistance (or low-conductance) crystalline state and a low-resistance (or high-conductance) amorphous state, which results from the PCM material having decreased carrier density upon crystallization.

The phase-change element 110 is formed of any material having inverse resistivity characteristics, which is suitable for the given application. For example, in some embodiments, the phase-change element 110 comprises an alloy of chromium, germanium, and tellurium. In particular, in some embodiments, the phase-change element 110 comprises $Cr_2Ge_2Te_6$. Furthermore, in some embodiments, as explained in further detail below, the phase-change material of the phase-change element 110 is selected, or otherwise configured via doping or adjusting the alloy composition, etc., to have a tunable rate of crystallization of the amorphous phase as a function of temperature.

The first and second electrodes 120-1 and 120-2 each comprise a conductive contact layer 122, an embedded resistive heater element 124 (alternatively, proximity heater element), and an electrical insulating layer 126, which is also a good thermal conductor as will be explained below. In addition, the first electrode 120-1 comprises a first contact terminal 130-1 coupled to the contact layer 122 thereof. Similarly, the second electrode 120-2 comprises a second contact terminal 130-2 coupled to the contact layer 122 thereof. Furthermore, as shown in FIG. 1B, the first electrode 120-1 comprises first and second programming terminals 141-1 and 141-2 coupled to respective end portions of the resistive heater element 124 thereof. Similarly, the second electrode 120-2 comprises first and second programming terminals 142-1 and 142-2 coupled to respective end portions of the resistive heater element 124 thereof. The first and second contact terminals 130-1 and 130-2 are utilized to perform a read operation to determine a conductance state of the correlator device 100 (i.e., to determine a conductance of the phase-change element 110 between the first and second electrodes 120-1 and 120-2). The programming terminals 141-1/141-2 and 142-1/142-2 are utilized to applying programming pulses to the resistive heater elements 124 of the first and second electrodes 120-1 and 120-2 to program the conductive state of the correlator device 100. With this exemplary configuration of the separate contact terminals and programming terminals, read and programming operations can be performed in an independent and non-synchronized manner.

In some embodiments, the conductive contact layers 122 of the first and second electrodes 120-1 and 120-2 are formed of an electrically and thermally conductive material such as tungsten, other metallic materials which are suitable for the given application. The resistive heater elements 124 of the first and second electrodes 120-1 and 120-2 are configured to generate heat by ohmic heating (or joule heating) in response to programming signals that are applied to the respective programming terminals 141-1/141-2 and 142-1/142-2. In some embodiments, the resistive heater elements 124 are formed of a resistive material such as tantalum nitride (TaN), hydrogen-doped carbon, or other types of materials that are suitable for the given application. The desired electrical resistivity of the resistive heater elements 124 can be achieved by adjusting the composition of the resistive material (e.g., adjusting an amount of nitrogen of the TaN material of the resistive heater elements 124, adjusting the cross-sectional area of the resistive heater elements 124 (e.g., reducing a thickness of the layer of resistive material, etc.).

The electrical insulating layers 126 of the first and second electrodes 120-1 and 120-2 are formed of a material which (i) electrically insulates the resistive heater elements 124 from the conductive contact layers 122 of the first and second electrodes 120-1 and 120-2, and which (ii) provides sufficient thermal conductivity to transfer the heat energy generated by the resistive heater elements 124 to the conductive contact layers 122 to thereby heat the phase-change material of the phase-change element 110 in proximity to the first and second electrodes 120-1 and 120-2. In some embodiments, the electrical insulating layers 126 are formed of aluminum nitride (AlN), hexagonal boron nitride (h-BN), cubic boron nitride (c-BN), diamond (e.g., CVD-diamond), or other types of materials having good electrically insulating and thermal conductance properties, which are suitable for the given application.

In some embodiments, the first and second electrodes 120-1 and 120-2 are embedded in a layer of insulating material (not specifically shown) which is sufficient to electrically and thermally insulate the first and second electrodes 120-1 and 120-2 from the phase-change elements 110. For example, the layer of insulating material can be formed of silicon oxide (e.g., silicon dioxide) or a low-k dielectric material (e.g., porous dielectric material), etc.

The correlator device 100 provides an exemplary implementation inverse resistively PCM device for implementing SPDP event correlation. The correlator device 100 forms an electrical connection between the first and second electrodes 120-1 and 120-2 through the phase-change element 110 when a time difference between two event pulses (programming pulses), which are applied to the respective programming terminals 141-1/141-2 and 142-1/142-2, is relatively short. The smaller the time difference is between two event pulses, which are applied to the respective programming terminals 141-1/141-2 and 142-1/142-2, the higher the conductance is of the electrical connection that forms between the first and second electrodes 120-1 and 120-2 through the phase-change element 110. Furthermore, the electrical connection that forms between the first and second electrodes 120-1 and 120-2 will slowly fade, by decreasing the conductance, if no additional programming pulses are applied to the programming terminals of the first and second electrodes 120-1 and 120-2. Various modes of operation and programming states of the correlator device 100 will now be described in further detail in conjunction with FIGS. 2A-2D, 3A-3D, 4A-4D, and 5.

Figure 2A:
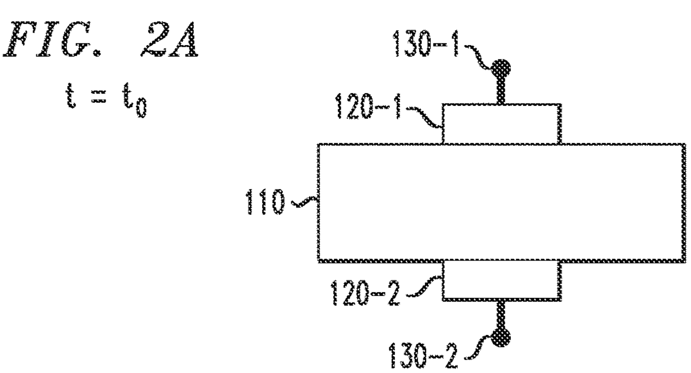
FIGS. 2A, 2B, 2C, and 2D schematically illustrate a method for event correlation using the exemplary correlator device of FIGS. 1A and 1B, according to an exemplary embodiment of the disclosure.

For example, FIGS. 2A, 2B, 2C, and 2D schematically illustrate a method for event correlation using the exemplary correlator device 100 of FIGS. 1A and 1B, according to an exemplary embodiment of the disclosure. As noted above, the phase-change element 110 of the correlator device 100 is formed with an inverse resistivity phase-change material which has a high conductance in the amorphous phase and a low conductance in the crystalline phase. FIG. 2A illustrates a point in time $t=t_0$ when the entire material of the phase-change element 110 is in a crystalline phase (low conductance state), such that that no electrical connection exists between the first and second electrodes 120-1 and 120-2. In other words, since the phase-change element 110 is in a crystalline state (low conductance state), the first and second electrodes 120-1 and 120-2 are effectively electrically disconnected as a result of the low-conductance (or high-resistance) electrical path through the phase-change element 110 between the first and second electrodes 120-1 and 120-2.

Figure 2B:
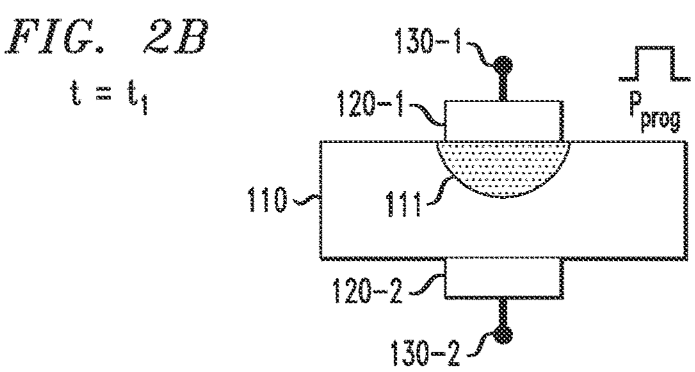

Next, FIG. 2B illustrates a point in time $t=t_1$ when a programming pulse ($P_{prog}$) (e.g., a pulse that causes the formation of an amorphous region adjacent to the electrode) is applied to a programming terminal (not shown) of the first electrode 120-1, which causes the proximity heater element of the first electrode 120-1 to heat the region of the phase-change element 110 in contact with, and in proximity to, the first electrode 120-1. The programming pulse, and the resulting heat generated by the proximity heater element, causes a volume of amorphous phase-change material 111 to form in the region of the phase-change element 110 in proximity to the first electrode 120-1. While the volume of amorphous phase-change material 111 has a high conductance, the first and second electrodes 120-1 and 120-2 remain effectively electrically disconnected due to the low conductance region of crystalline phase-change material between the volume of amorphous phase-change material 111 and the second electrode 120-2.

Figure 2C:
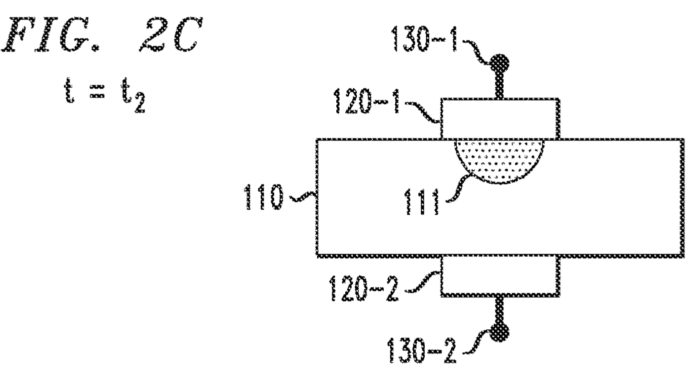

Next, FIG. 2C illustrates a point in time $t=t_2$ where no programming pulses have been applied to the programming terminals of either the first electrode 120-1 or the second electrode 120-2 (since the previous time $t=t_1$), and the volume of amorphous phase-change material 111 has decreased as a result of the amorphous phase-change material crystallizing over time. In some embodiments, the correlator device 100 is maintained at a target temperature (e.g., ambient temperature) which causes the volume of amorphous phase-change material 111 to crystallize at target rate in the absence of a programming pulse being applied to the programming terminal of the first electrode 120-1. Again, while the volume of amorphous phase-change material 111 has a high conductance, the first and second electrodes 120-1 and 120-2 remain effectively electrically disconnected due to the low conductance region of crystalline phase-change material between the volume of amorphous phase-change material 111 and the second electrode 120-2.

Figure 2D:
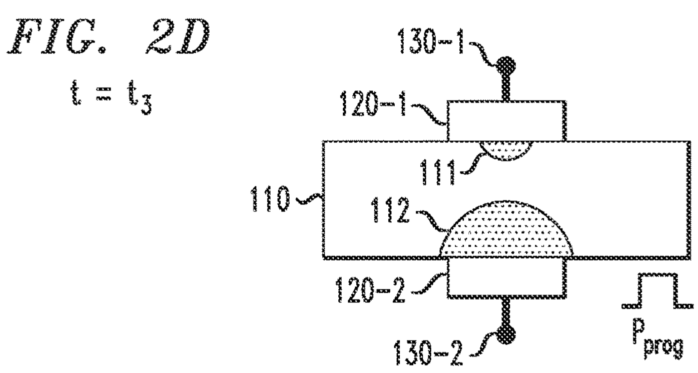

Next, FIG. 2D illustrates a point in time $t=t_3$ when a programming pulse ($P_{prog}$) is applied to the programming terminal (not shown) of the second electrode 120-2, which causes the proximity heater element of the second electrode 120-2 to heat the region of the phase-change element 110 in contact with, and in proximity to, the second electrode 120-2. The programming pulse, and the resulting heat generated by the proximity heater element, causes a volume of amorphous phase-change material 112 to form in the region of the phase-change element 110 in proximity to the second electrode 120-2. Furthermore, FIG. 2D illustrates a point in time where no programming pulses have been applied to the programming terminal of the first electrode 120-1 (since the previous time $t=t_1$), and the volume of amorphous phase-change material 111 has further decreased as a result of the amorphous phase-change material crystallizing over time. While the volumes of amorphous phase-change material 111 and 112 have a high conductance, the first and second electrodes 120-1 and 120-2 in FIG. 2D remain effectively electrically disconnected due to the low conductance region of crystalline phase-change material between the volumes of amorphous phase-change material 111 and 112.

The exemplary timing sequence shown in FIGS. 2A-2D illustrates a circumstance in which there is no correlation (or otherwise a relatively small correlation) between the programming pulses (events) that occur at times $t_1$ and $t_3$ because, at time $t_3$ there is a relatively high resistance path through the phase-change element 110 between the first and second electrodes 120-1 and 120-2, despite the existence of the high-conductance volumes of amorphous phase-change material 111 and 112 near the respective first and second electrodes 120-1 and 120-2. This is due to the relatively large time difference (t3−t1) between the time $t_1$ when the first programming pulse was applied to the programming terminal of the first electrode 120-1 and the time $t_3$ when the second programming pulse was applied to the programming terminal of the second electrode 120-2, resulting in no contact or overlapping of the volumes of amorphous phase-change material 111 and 112.

Figure 3A:
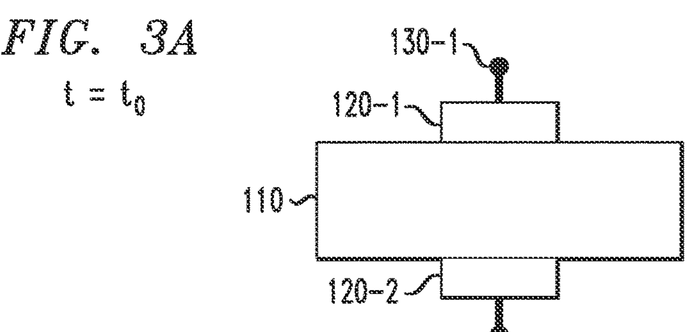
FIGS. 3A, 3B, 3C, and 3D schematically illustrate a method for event correlation using the exemplary correlator device of FIGS. 1A and 1B, according to another exemplary embodiment of the disclosure.

On the other hand, an exemplary timing sequence shown in FIGS. 3A-3D illustrates a circumstance in which a correlation is determined to exist between two programming pulses (events) that occur close in time to each other. In particular, FIGS. 3A, 3B, 3C, and 3D schematically illustrate a method for event correlation using the exemplary correlator device 100 of FIGS. 1A and 1B. FIG. 3A illustrates a point in time $t=t_0$ when the entire material of the phase-change element 110 is in a crystalline phase (low conductance state), such that that no electrical connection exists between the first and second electrodes 120-1 and 120-2 (i.e., the first and second electrodes 120-1 and 120-2 are effectively electrically disconnected as a result of the low-conductance (or high-resistance) electrical path through the phase-change element 110 between the first and second electrodes 120-1 and 120-2).

Figure 3B:
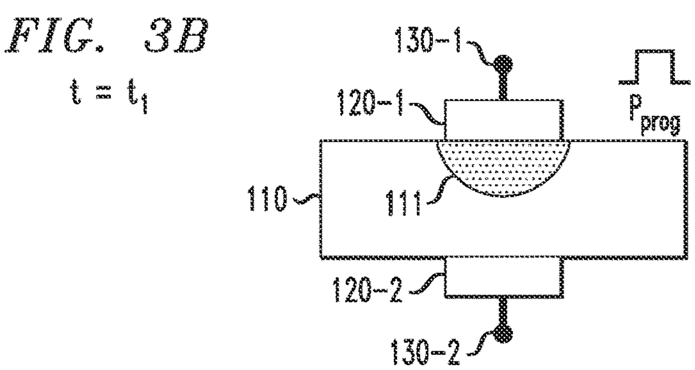

Next, FIG. 3B illustrates a point in time $t=t_1$ when a programming pulse ($P_{prog}$) is applied to the programming terminal (not shown) of the first electrode 120-1, which causes the proximity heater element of the first electrode 120-1 to heat the region of the phase-change element 110 in contact with, and in proximity to, the first electrode 120-1. The programming pulse, and the resulting heat generated by the proximity heater element, causes a volume of amorphous phase-change material 111 to form in the region of the phase-change element 110 in proximity to the first electrode 120-1. While the volume of amorphous phase-change material 111 has a high conductance, the first and second electrodes 120-1 and 120-2 remain effectively electrically disconnected due to the low conductance region of crystalline phase-change material between the volume of amorphous phase-change material 111 and the second electrode 120-2.

Figure 3C:
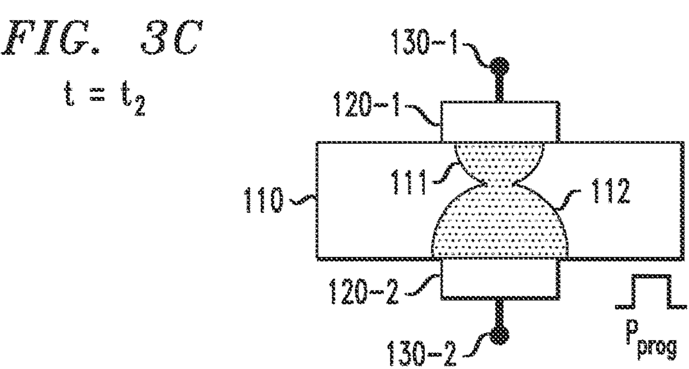

Next, FIG. 3C illustrates a point in time $t=t_2$ when a programming pulse ($P_{prog}$) is applied to the programming terminal (not shown) of the second electrode 120-2, which causes the proximity heater element of the second electrode 120-2 to heat the region of the phase-change element 110 in contact with, and in proximity to, the second electrode 120-2. The programming pulse, and the resulting heat generated by the proximity heater element, causes a volume of amorphous phase-change material 112 to form in the region of the phase-change element 110 in proximity to the second electrode 120-2. FIG. 3C further illustrates a circumstance in which no programming pulse has been applied to the programming terminal of the first electrode 120-1 (since the previous time $t_1$), whereby the volume of amorphous phase-change material 111 has decreased as a result of the amorphous phase-change material crystallizing over time.

Despite the reduction the volume of amorphous phase-change material 111 in FIG. 3C, since there is a relatively short time difference ($t_2-t_1$) between the time $t_1$ when the first programming pulse was applied to the programming terminal of the first electrode 120-1 and the time $t_2$ when the second programming pulse was applied to the programming terminal of the second electrode 120-2, FIG. 3C schematically illustrates a circumstance in which there is actual contact or overlapping of the volumes of amorphous phase-change material 111 and 112. In this instance, a high-conductance (or low-resistance) electrical connection exists through the phase-change element 110 between the first and second electrodes 120-1 and 120-2 at time $t=t_2$, which provides an indication that a correlation exists between the events (programming pulses) that occur at times $t_1$ and $t_2$.

Figure 3D:
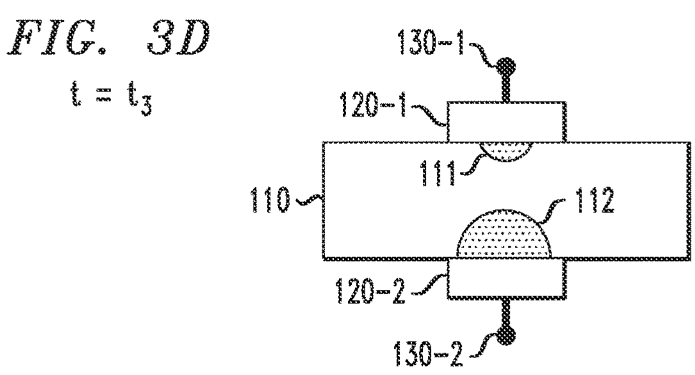

Next, FIG. 3D illustrates a point in time $t=t_3$ where no programming pulses have been applied to the programming terminals of the either the first electrode 120-1 or the second electrode 120-2 (since the previous time $t=t_2$). As a result, FIG. 3D shows that the volumes of amorphous phase-change material 111 and 112 are decreased as a result of the amorphous phase-change material crystallizing over time. At time $t=t_3$, while the volumes of amorphous phase-change material 111 and 112 have a high conductance, the first and second electrodes 120-1 and 120-2 are effectively electrically disconnected due to the low conductance region of crystalline phase-change material between the volumes of amorphous phase-change material 111 and 112.

FIGS. 2A-2D and 3A-3D illustrate exemplary embodiments in which the phase-change material of the phase-change element 110 comprises a "growth dominated" crystallization property. With a growth dominated crystallization process, the amorphous phase-change material at the boundary with the crystalline phase-change material will recrystallize by templating from the surrounding crystalline phase-change material. With this process, the volume of the amorphous phase-change material reduces over time as the boundary region of the amorphous phase-change material crystallizes. In other embodiments, the phase-change material of the phase-change element 110 comprises a "nucleation dominated" crystallization property. With a nucleation dominated crystallization process, small crystallites spontaneously form within a volume of amorphous phase-change material, and continue to grow until the all or most of the original volume of amorphous phase-change material becomes crystalline phase-change material.

In some embodiments, the phase-change material of the phase-change element 110 comprises both growth and nucleation crystallization properties, but wherein one type of crystallization process is dominant over the other crystallization process. In all embodiments, the temperature of the phase-change element 110 is maintained at a target temperature where the amorphous phase-change material of the phase-change element 110 is not stable, and recrystallizes as a given rate (via growth and/or nucleation crystallization) such that the phase-change material of the phase-change element 110 eventually becomes completely (or substantially) crystalline (in the absence of any programming pulses applied to the programming terminals of the first or second electrodes 120-1 and 120-1 for a relatively long period of time.

Figure 4A:
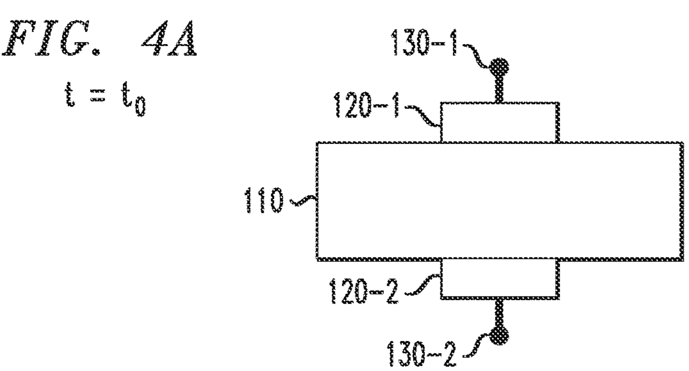
FIGS. 4A, 4B, 4C, and 4D schematically illustrate a method for event correlation using the exemplary correlator device of FIGS. 1A and 1B, according to another exemplary embodiment of the disclosure.

FIGS. 4A, 4B, 4C, and 4D schematically illustrate a method for event correlation using the exemplary correlator device 100 of FIGS. 1A and 1B in an exemplary embodiment where the phase-change material of the phase-change element 110 comprises a "nucleation dominated" crystallization property. In particular, FIG. 4A illustrates a point in time $t=t_0$ when the entire material of the phase-change element 110 is in a crystalline phase (low conductance state), such that no electrical connection exists between the first and second electrodes 120-1 and 120-2, i.e., the first and second electrodes 120-1 and 120-2 are effectively electrically disconnected as a result of the low-conductance (or high-resistance) electrical path through the phase-change element 110 between the first and second electrodes 120-1 and 120-2.

Figure 4B:
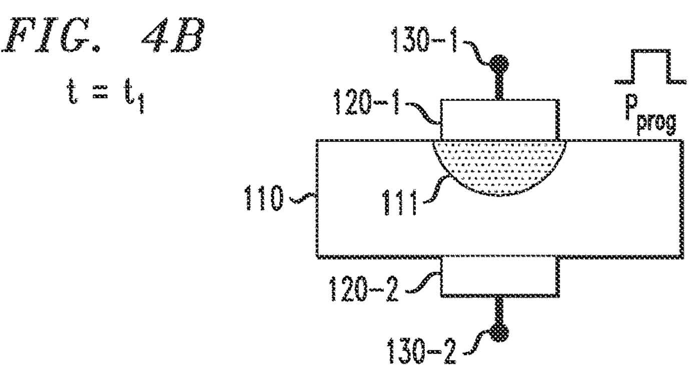

Next, FIG. 4B illustrates a point in time $t=t_1$ when a programming pulse ($P_{prog}$) is applied to the programming terminal (not shown) of the first electrode 120-1, which causes the proximity heater element of the first electrode 120-1 to heat the region of the phase-change element 110 in contact with, and in proximity to, the first electrode 120-1. The programming pulse, and the resulting heat generated by the proximity heater element, causes a volume of amorphous phase-change material 111 to form in the region of the phase-change element 110 in proximity to the first electrode 120-1. While the volume of amorphous phase-change material 111 has a high conductance, the first and second electrodes 120-1 and 120-2 remain effectively electrically disconnected due to the low conductance region of crystalline phase-change material between the volume of amorphous phase-change material 111 and the second electrode 120-2.

Figure 4C:
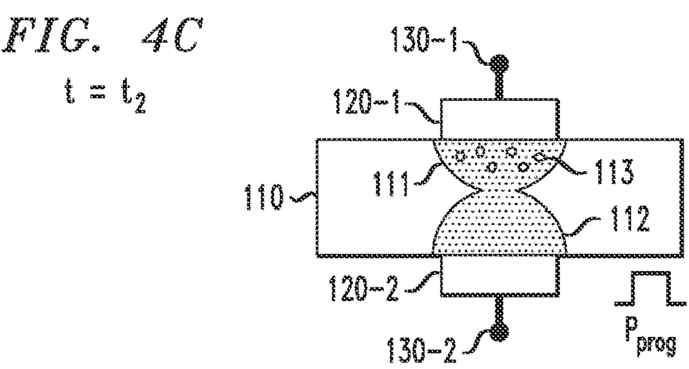

Next, FIG. 4C illustrates a point in time $t=t_2$ when a programming pulse ($P_{prog}$) is applied to the programming terminal (not shown) of the second electrode 120-2, which causes the proximity heater element of the second electrode 120-2 to heat the region of the phase-change element 110 in contact with, and in proximity to, the second electrode 120-2. The programming pulse, and the resulting heat generated by the proximity heater element, causes a volume of amorphous phase-change material 112 to form in the region of the phase-change element 110 in proximity to the second electrode 120-2. FIG. 4C further illustrates a circumstance in which no programming pulse has been applied to the programming terminal of the first electrode 120-1 (since the previous time $t_1$), whereby a number of crystallites 113 comprising crystalline phase-change material have formed in the volume of amorphous phase-change material 111 over time.

Since there is a relatively short time difference ($t_2$-$t_1$) between the time $t_1$ when the first programming pulse was applied to the programming terminal of the first electrode 120-1 and the time $t_2$ when the second programming pulse was applied to the programming terminal of the second electrode 120-2, FIG. 4C schematically illustrates a circumstance in which there is actual contact or overlapping of the volumes of amorphous phase-change material 111 and 112. In this instance, despite the formation of the crystallites 113 in the volume of amorphous phase-change material 111, a relatively high-conductance (or low-resistance) electrical path exists through the phase-change element 110 between the first and second electrodes 120-1 and 120-2 at time $t=t_2$, which provides an indication that a correlation exists between the events (programming pulses) that occur at times $t_1$ and $t_2$.

Figure 4D:
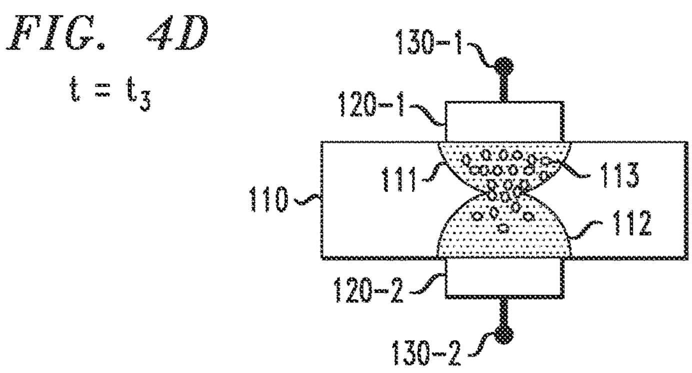

Next, FIG. 4D illustrates a point in time $t=t_3$ where no programming pulses have been applied to the programming terminals of either the first electrode 120-1 or the second electrode 120-2 (since the previous time $t=t_2$). As a result, FIG. 4D shows that the volumes of amorphous phase-change material 111 and 112 have an increasing number of crystallites 113 formed therein. In addition, while the volumes of amorphous phase-change material 111 and 112 are still in contact, the electrical conductivity of the connection between the first and second electrodes 120-1 and 120-2 is decreased (as compared to FIG. 4C) due to the increased number of high-resistance crystallites 113 formed in the volumes of amorphous phase-change material 111 and 112. While not specifically shown in FIG. 4D, the volumes of amorphous phase-change material 111 and 112 can also shrink due to a growth crystallization process at the boundaries between the volumes of amorphous phase-change material 111 and 112 and the surrounding crystalline phase-change material of the phase-change element 110. Irrespective of the crystallization process of the phase-change material, it is to be understood that the electrical response of the correlator device 100 is substantially the same.

Figure 5:
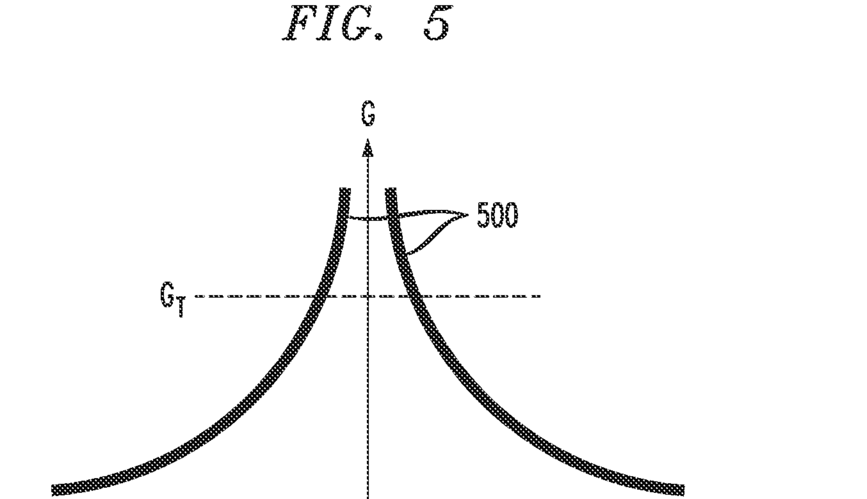
FIG. 5 is a graph which illustrates a conductance of a correlator device comprising inverse resistivity phase-change material as a function of a time difference between events, according to an exemplary embodiment of the disclosure.

As shown in FIGS. 2A-2D, 3A-3D, and 4A-4D, the correlator device 100 device implements a STDP process in which the electrical conductivity (G) of an electrical path through the phase-change element 110 between the first and second electrodes 120-1 and 120-2 will vary depending on a time difference between programming pulses (events) that are applied to the programming terminals of the first and second electrodes 120-1 and 120-2. The shorter the time difference between two events, the greater conductivity between the first and second electrodes 120-1 and 120-2, and thus, the greater the correlation is between the two events. FIG. 5 is a graph which illustrates a conductance of a correlator device (e.g., the correlator device 100) comprising inverse resistivity phase-change material as a function of a time difference between events, according to an exemplary embodiment of the disclosure.

In particular, FIG. 5 illustrates a conductance curve 500 which shows an electrical conductivity G measured between the first and second electrodes 120-1 and 120-2 of the correlator device 100 as function of a time difference $t_i - t_{i+1}$ between two successive events. FIG. 5 shows that the smaller the time difference, the greater the conductance G, and vice versa. In some embodiments, the amount of correlation between two successive events will be quantified based on the measured conductance G which is measured between the first and second electrodes 120-1 and 120-2 of the correlator device 100, wherein the conductance G corresponds to the time difference between the two successive events, and thus indicates the level of correlation between the two successive events. In other embodiments, a correlation between two events can be, e.g., a binary determination, wherein two events are deemed to be (i) correlated if the measured conductance G exceeds a predetermined threshold value ($G_T$) as shown in FIG. 5, or (ii) uncorrelated if the measured conductance is less than $G_T$.

FIG. 5 illustrates that a correlator device is structurally configured to provide a time-dependent resistance between first and second electrodes of the correlator device, wherein the time-dependent resistance is proportional to a time difference between event pulses that are applied to the programming terminals of the first and second electrodes. In some embodiments, a memory of the time difference between event pulses as captured by the time-dependent resistance is tuned by the temperature of the correlator device. For example, a higher temperature gives more weight to shorter time difference between pulses. As noted above, a correlator device is maintained at a target temperature to achieve a target rate of recrystallization of amorphous phase-change material. The higher the temperature, the faster the rate of crystallization of amorphous phase-change material. The rate of crystallization can be tuned (via temperature) to achieve a target rate (e.g., second, hour, day, etc.) depending on the application. In other embodiments, the rate of crystallization can be tuned by doping and/or varying the alloy composition of the phase-change material to provide an unstable amorphous phase with a relatively low crystallization temperature.

Figure 6:
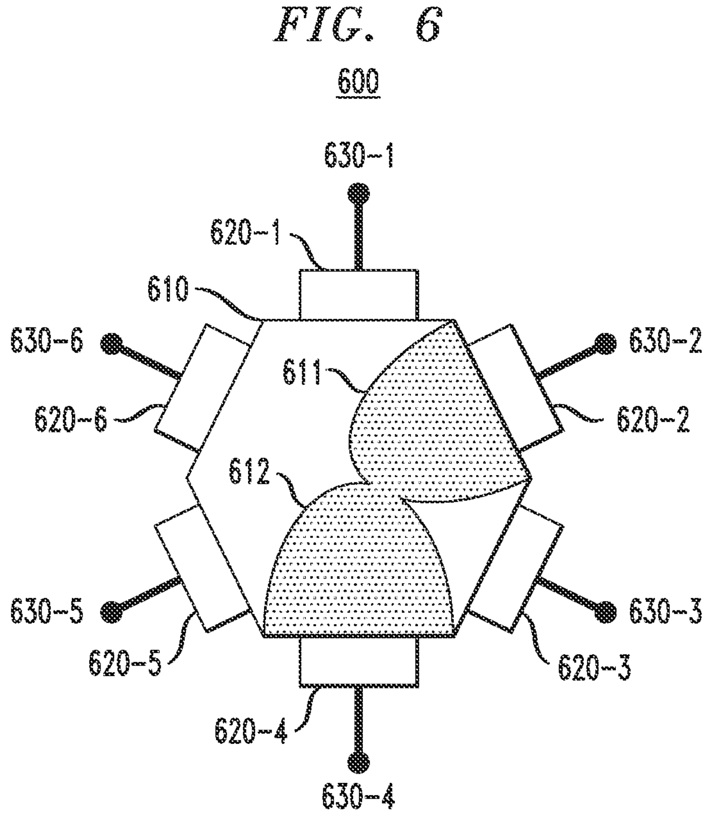
FIG. 6 schematically illustrates a correlator device comprising inverse resistivity phase-change material for spike-timing-dependent plasticity, according to another exemplary embodiment of the disclosure.

While the exemplary correlator device 100 of FIGS. 1A and 1B comprises two electrodes, correlator devices can be constructed with more than two electrodes. For example, FIG. 6 schematically illustrates a correlator device 600 comprising inverse resistivity phase-change material for spike-timing-dependent plasticity, according to another exemplary embodiment of the disclosure in which the correlator device 600 comprises six electrodes. More specifically, the correlator device 600 comprises a multifaceted phase-change element 610 having multiple angled planar surfaces. The correlator device 600 comprises a plurality of electrodes 620-1, 620-2, 620-3, 620-4, 620-5, and 620-6 which are disposed on respective ones of the angled planar surfaces, and which comprise respective contact terminals 630-1, 630-2, 630-3, 630-4, 630-5, and 630-6. In some embodiments, the electrodes 620-1, 620-2, 620-3, 620-4, 620-5, and 620-6 comprise the same or similar structural configuration as the first and second electrodes 120-1 and 120-2, as shown in FIGS. 1A and 1B.

For illustrative purposes, FIG. 6 illustrates an exemplary conductance state of the correlator device 600 in which is assumed that two successive event pulses were applied to the proximity heater elements of the electrodes 620-2 and 620-4 within a relatively short time period, resulting in the formation of contacting/overlapping volumes of amorphous phase-change material 611 and 612, thereby forming a low-resistance electrical connection through the phase-change elements 610 between the electrodes 620-2 and 620-4. In addition, the exemplary state of the correlator device 600 as shown in FIG. 6 assumes that no event pulses were applied to the proximity heater elements of the electrodes 620-1, 620-3, 620-5, and 620-6, such that the electrodes 620-1, 620-3, 620-5, and 620-6 remain effectively electrically disconnected by the crystalline material of the phase-change element 610 in contact to the electrodes 620-1, 620-3, 620-5, and 620-6.

Figure 7:
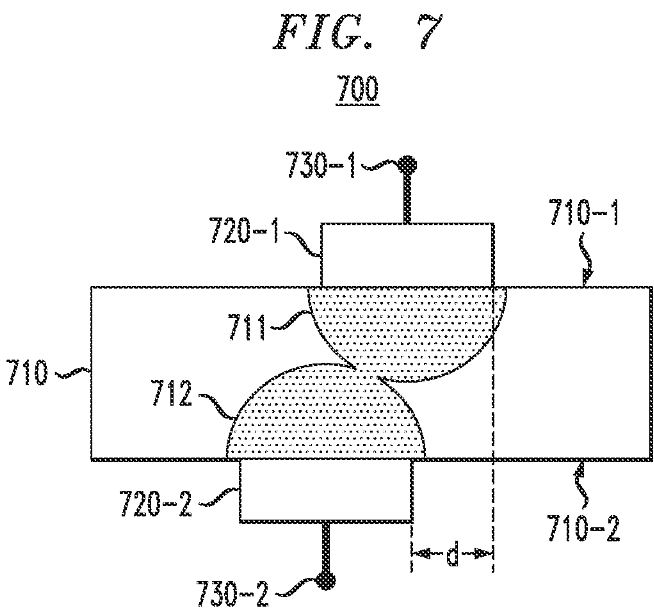
FIG. 7 schematically illustrates a correlator device comprising inverse resistivity phase-change material for spike-timing-dependent plasticity, according to another exemplary embodiment of the disclosure.

FIG. 7 schematically illustrates a correlator device comprising inverse resistivity phase-change material for spike-timing-dependent plasticity, according to another exemplary embodiment of the disclosure. More specifically, FIG. 7 schematically illustrates a correlator device 700 which comprises a phase-change element 710, a first electrode 720-1 disposed on a first surface 710-1 of the phase-change element 710, and a second electrode 720-2 disposed on a second surface 710-2 of the phase-change element 710. The first and second surfaces 710-1 and 710-2 of the phase-change element 710 comprise opposite parallel surfaces of the phase-change element 710.

As further shown in FIG. 7, the first and second electrodes 720-1 and 720-2 have a same geometric footprint but are disposed in alignment with a predefined offset d to each other on the opposite parallel surfaces 710-1 and 710-2 of the phase-change element 710. In the exemplary embodiment of FIG. 7, the predefined offset d provides a mechanism to tune the conductance curve (e.g., curve 500, FIG. 5) and, thereby, tune the correlation response of the correlator device 700. For example, the larger the offset d, the closer in time two event pulses (which are applied to the programming terminals of the first and second electrodes 720-1 and 720-2) will need to be in order to generate respective volumes of amorphous phase-change material 711 and 712 which actually contact or overlap to provide a low-resistance electrical connection between the first and second electrodes 720-1 and 720-2. As such, the amount of offset d can be selected to tune the conductance curve of the correlator device 800 as a function of the time difference between two successive programing pulses applied to the programming terminals of the first and second electrodes 720-1 and 720-2.

Figure 8:
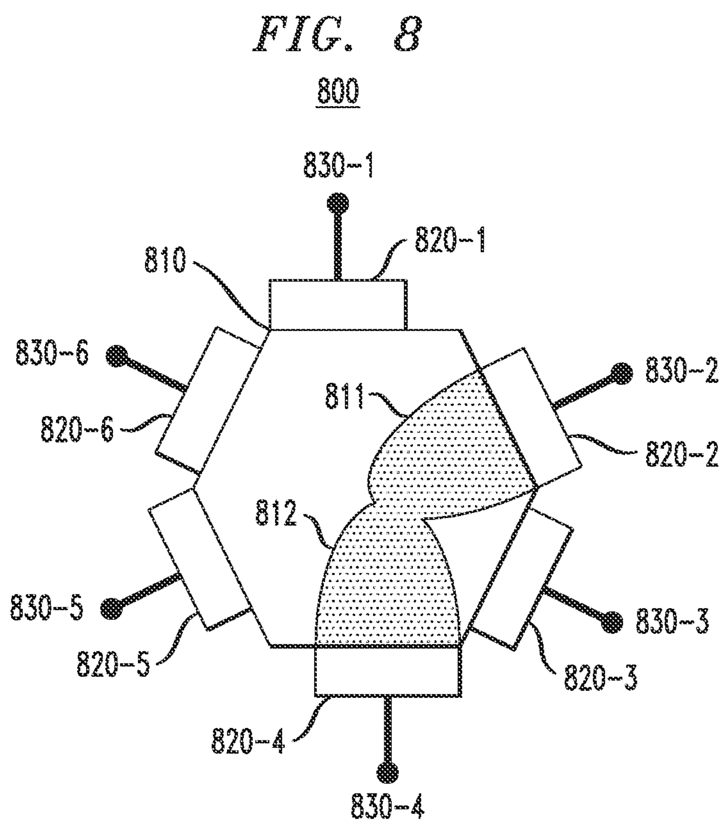
FIG. 8 schematically illustrates a correlator device comprising inverse resistivity phase-change material for spike-timing-dependent plasticity, according to another exemplary embodiment of the disclosure.

FIG. 8 schematically illustrates a correlator device comprising inverse resistivity phase-change material for spike-timing-dependent plasticity, according to another exemplary embodiment of the disclosure. More specifically, FIG. 8 schematically illustrates a correlator device 800 which comprises a multifaceted phase-change element 810 having multiple angled planar surfaces. The correlator device 800 comprises a plurality of electrodes 820-1, 820-2, 820-3, 820-4, 820-5, and 820-6 which are disposed on respective ones of the angled planar surfaces, and which comprise respective contact terminals 830-1, 830-2, 830-3, 830-4, 830-5, and 830-6. In some embodiments, the electrodes 820-1, 820-2, 820-3, 820-4, 820-5, and 820-6 comprise the same or similar structural configuration as the first and second electrodes 120-1 and 120-2, as shown in FIGS. 1A and 1B.

The correlator device 800 is similar in structure and operation as the correlator device 600 (FIG. 6), but the correlator device 800 has one or more electrodes which are disposed with offsets relative to the center of the planar surfaces so that some electrodes are closer or further from each other. For example, as shown in FIG. 8, the electrodes 820-1, 820-2, 820-4, and 820-5 are offset from the centers of the respective planar surfaces of the phase-change element 810 on which such electrodes are disposed. For example, in the exemplary configuration, the electrodes 820-2 and 820-4 are closer in distance to each other such that two event pulses which are applied to the programming terminals of the electrodes 820-2 and 820-4 can be further in time from each other while generating respective volumes of amorphous phase-change material 811 and 812 which actually contact or overlap to provide a low-resistance electrical connection between the electrodes 820-2 and 820-4. In this regard, similar to the correlator device 700 of FIG. 7, the offset positioning of the electrodes of the correlator device 800 provides a mechanism to tune the conductance curve (e.g., curve 500, FIG. 5) and, thereby, tune the correlation response of the correlator device 800 with respect to different pairs of the electrodes.

Figure 9:
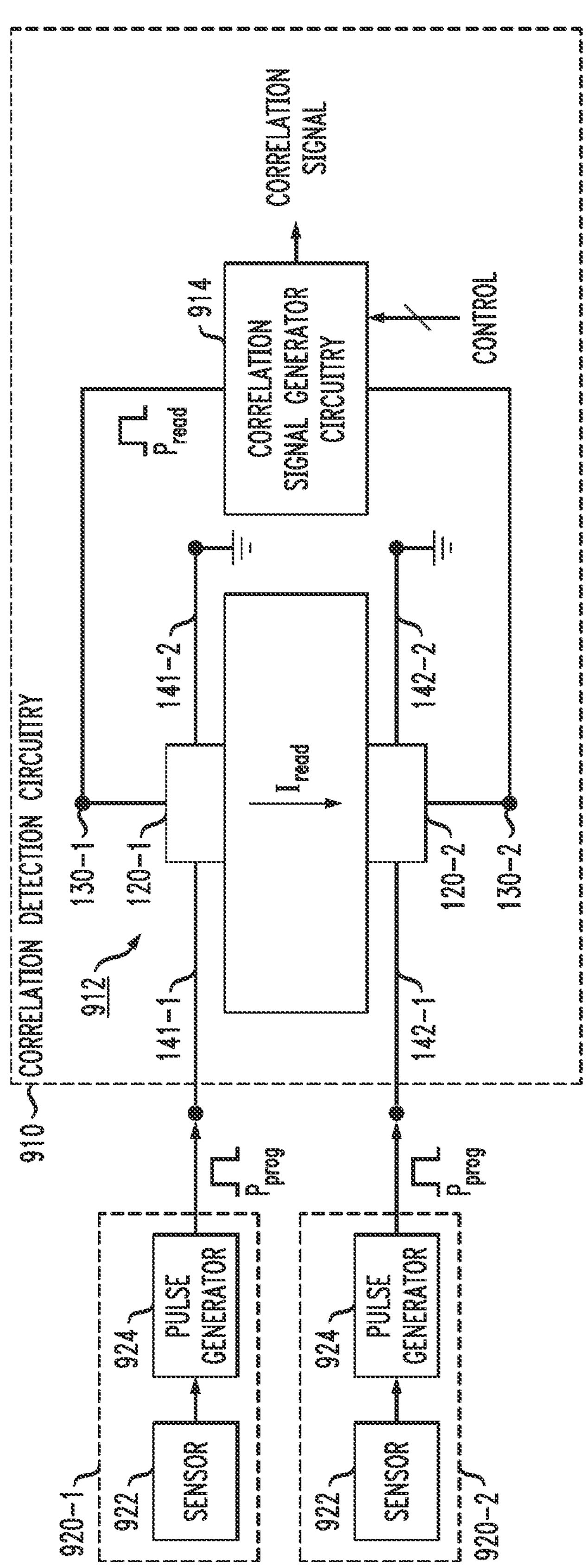
FIG. 9 schematically illustrates a correlator detection system which is implemented using an inverse resistivity phase-change material device for spike-timing-dependent plasticity, according to an exemplary embodiment of the disclosure.

FIG. 9 schematically illustrates a correlation detection system 900 which is implemented using an inverse resistivity phase-change material device for spike-timing-dependent plasticity, according to an exemplary embodiment of the disclosure. The correlation detection system 900 comprises correlation detection circuitry 910, a first event pulse generator 920-1 and a second event pulse generator 920-2. The correlation detection circuitry 910 comprises a correlator device 912 and correlation signal generator circuitry 914. In some embodiments, the correlator device 912 is implemented using the correlator device 100 of FIGS. 1A and 1B. In other embodiments, the correlator device 912 can be implemented using the exemplary embodiments shown, for example, in FIG. 6, 7, or 8.

As further shown in FIG. 9, the first event pulse generator 920-1 has an output coupled to the first programming terminal 141-1 of the first electrode 120-1, and the second event pulse generator 920-2 has an output coupled to the first programming terminal 142-1 of the second electrode 120-2. The second programming terminals 141-2 and 142-2 of the respective first and second electrodes 120-1 and 120-2 are connected to ground voltage (e.g., V=0). Furthermore, the correlation signal generator circuitry 914 is coupled to the first and second contact terminals 130-1 and 130-2 of the respective first and second electrodes 120-1 and 120-2.

The first and second event pulse generators 920-1 and 920-2 each comprise a sensor device 922, and a pulse generator circuit 924. The sensor devices 922 can be any type of sensor device which is configured to detect for the occurrence of a given event, depending on the application. The sensor devices 922 are configured to output respective sensor signals to the respective pulse generator circuits 924 when the sensor devices 922 detect target events. The pulse generator circuits 924 are configured to generate programming pulses ($P_{prog}$) in response to the sensor signals output from the respective sensor devices 922. The programming pulses ($P_{prog}$) are applied to the respective programming terminals 141-1 and 142-1 of the first and second electrodes 120-1 and 120-2 to cause joule heating of the proximity heater elements of the first and second electrodes 120-1 and 120-2. As noted above, the joule heating changes the conductance state of the correlator device 912 by forming a volume of amorphous phase-change material in the phase-change elements 110 in proximity to one or both of the first and second electrodes 120-1 and 120-1, using an STDP process as discussed above in conjunction with, e.g., FIGS. 2A-2D, 3A-3D, or 4A-4D.

The correlation signal generator circuitry 914 is configured to perform a read operation to read a conductance state of the programmed correlator device 912, and generate a correlation signal which indicates the conductance state of the programmed correlator device 912, and thus, the correlation between two successive programming pulses that are applied to the programming terminals 141-1 and 142-1. For example, in some embodiments, the correlation signal generator circuitry 914 is configured to generate and apply a read pulse ($P_{read}$) to the first electrode 120-1 to thereby generate a read current $I_{read}$ which flows through the phase-change element 110 from the first electrode 120-1 to the second electrode 120-2. The signal generator circuitry 914 is configured to receive the read current $I_{read}$ and determine a conductance state of the correlator device 912 based on the magnitude of the read current $I_{read}$. In some embodiments, a low conductance state of the correlator device 912 may correspond to a read current $I_{read}=I_0$, while a high conductance state of the correlator device 912 may correspond to a read current $I_{read}=100I_0$. The current magnitude $I_0$ depends on, e.g., the device geometry, the type of phase-change material used, etc. The current magnitude $I_0$ can be in the range of a few picoamps to hundreds of microamps. The correlation signal generator circuitry 914 generates a correlation signal based on the magnitude of the read current $I_{read}$ which indicates the conductance state of the programmed correlator device 912. The correlation signal provides an indication of whether two successive events are correlated. The correlation signal can vary based on a degree of correlation between two successive events.

The exemplary correlation detection circuit 900 provides an STDP event correlation mechanism in which the programming pulses $P_{prog}$ are applied to the resistive heater elements of the first and second electrodes 120-1 and 120-2 without causing current flow through the phase-change element 110, while the reading operation can be performed by the correlation signal generator circuitry 914 separate and independent from the programing operation performed by the event pulse generators 920-1 and 920-1. This configuration allows the phase-change material of the phase-change element 110 to be optimized independently of the current that is needed for programing. In some embodiments, the functions of the correlation signal generator circuitry 914 can be controlled or otherwise tuned by control signals from a remote controller or system.

FIG. 10 schematically illustrates a system which implements inverse resistivity phase-change material devices for neuromorphic computing, according to an exemplary embodiment of the disclosure. More specifically, FIG. 10 schematically illustrates a computing system 1000 which comprises a digital processing system 1010, and a neuromorphic computing system 1020. The digital processing system 1010 comprises a plurality of processor cores 1012. The neuromorphic computing system 1020 comprises a plurality of neural cores 1022. In some embodiments, the neuromorphic computing system 1020 comprises one or more neural cores which implement an artificial neural network 1024 which comprises one or more layers of artificial neurons, wherein the neuron layers are connected by arrays of artificial synaptic devices. In some embodiments, the artificial neuron devices are implemented using exemplary correlator devices as discussed herein, or in particular, the correlation detection circuitry 910 of FIG. 9. In such a configuration, the programming inputs of the correlator devices (e.g., artificial neurons) are connected to the outputs of respective artificial synapses which generate programming pulses (spikes) in response to excitation from pre-synaptic neurons that are coupled to the input of a given post-synaptic neuron via the synaptic devices.

In some embodiments, the digital processing system 1010 controls the execution of a process 1030 which utilizes the neuromorphic computing system 1020 to perform hardware accelerated computing operations. In some embodiments, the process 1030 implements an STDP network training process 1032 to train an artificial neural network (e.g., a forward-connected neural network) which is implemented by one or more of the neural cores 1022. In some embodiments, the process 1030 comprises an inference/classification process 1034, which utilizes a trained artificial neural network implemented in the neural cores 1022 to perform pattern recognition (e.g., image recognition, face recognition, etc.).

Exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

These concepts are illustrated with reference to FIG. 11, which schematically illustrates an exemplary architecture of a computing node that can host the computing system of FIG. 10, according to an exemplary embodiment of the disclosure. FIG. 11 illustrates a computing node 1100 which comprises a computer system/server 1112, which is operational with numerous other general purpose or special purpose computing system environments or configurations. Examples of well-known computing systems, environments, and/or configurations that may be suitable for use with computer system/server 1112 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1112 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1112 may be practiced in distributed cloud computing environments where tasks are performed by remote processing devices that are linked through a communications network. In a distributed cloud computing environment, program modules may be located in both local and remote computer system storage media including memory storage devices.

In FIG. 11, computer system/server 1112 in computing node 1100 is shown in the form of a general-purpose computing device. The components of computer system/server 1112 may include, but are not limited to, one or more processors or processing units 1116, a system memory 1128, and a bus 1118 that couples various system components including system memory 1128 to the processors 1116.

The bus 1118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1112 typically includes a variety of computer system readable media. Such media may be any available media that is accessible by computer system/server 1112, and it includes both volatile and non-volatile media, removable and non-removable media.

The system memory 1128 can include computer system readable media in the form of volatile memory, such as random-access memory (RAM) 1130 and/or cache memory 1132. The computer system/server 1112 may further include other removable/non-removable, volatile/nonvolatile computer system storage media. By way of example only, storage system 1134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1118 by one or more data media interfaces. As depicted and described herein, memory 1128 may include at least one program product having a set (e.g., at least one) of program modules that are configured to carry out the functions of embodiments of the invention.

The program/utility 1140, having a set (at least one) of program modules 1142, may be stored in memory 1128 by way of example, and not limitation, as well as an operating system, one or more application programs, other program modules, and program data. Each of the operating system, one or more application programs, other program modules, and program data or some combination thereof, may include an implementation of a networking environment. Program modules 1142 generally carry out the functions and/or methodologies of embodiments of the disclosure as described herein.

Computer system/server 1112 may also communicate with one or more external devices 1114 such as a keyboard, a pointing device, a display 1124, etc., one or more devices that enable a user to interact with computer system/server 1112, and/or any devices (e.g., network card, modem, etc.) that enable computer system/server 1112 to communicate with one or more other computing devices. Such communication can occur via Input/Output (I/O) interfaces 1122. Still yet, computer system/server 1112 can communicate with one or more networks such as a local area network (LAN), a general wide area network (WAN), and/or a public network (e.g., the Internet) via network adapter 1120. As depicted, network adapter 1120 communicates with the other components of computer system/server 1112 via bus 1118. It should be understood that although not shown, other hardware and/or software components could be used in conjunction with computer system/server 1112. Examples, include, but are not limited to: microcode, device drivers, redundant processing units, external disk drive arrays, RAID systems, SSD drives, and data archival storage systems, etc.

Additionally, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 12:
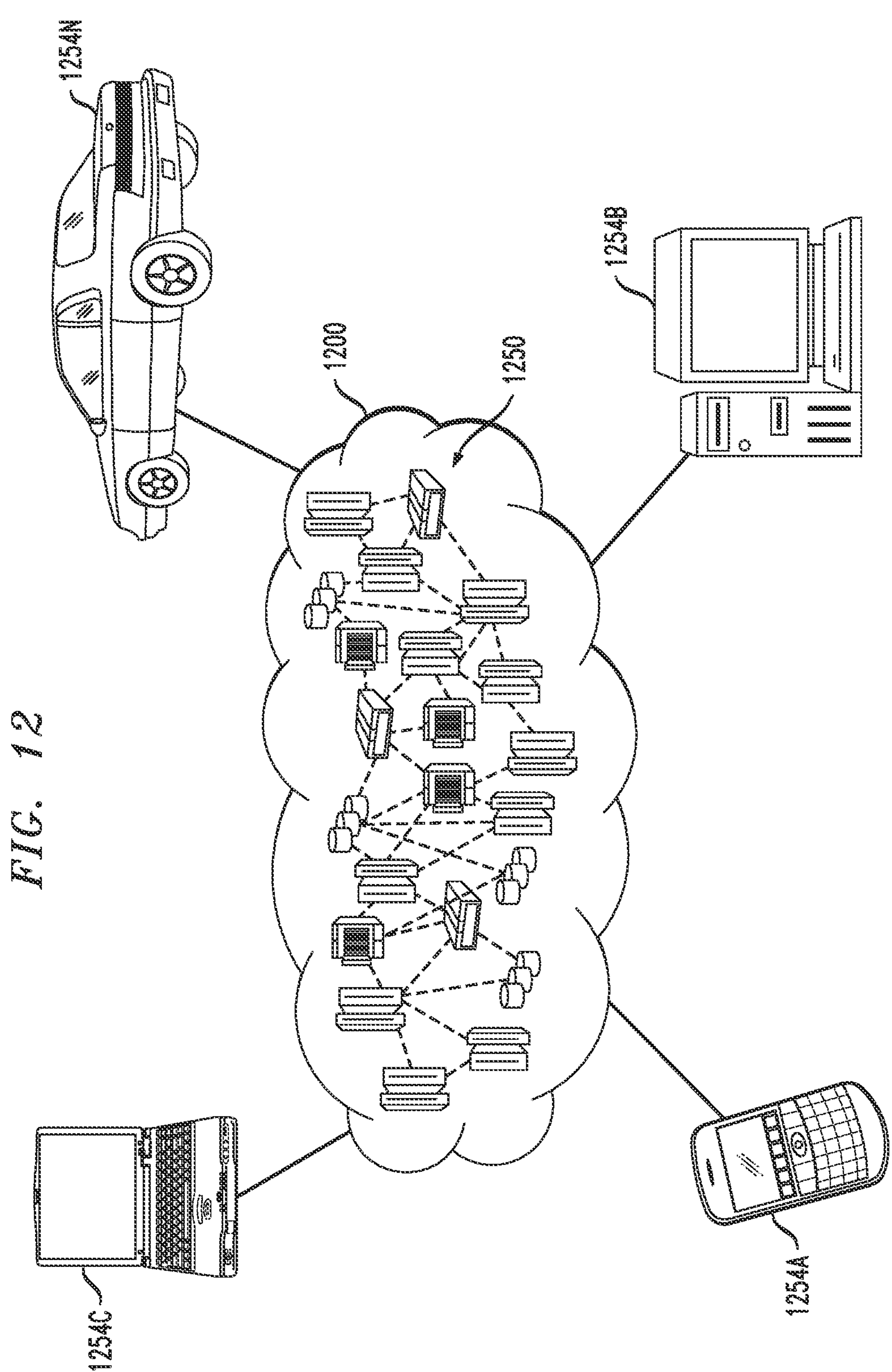
FIG. 12 depicts a cloud computing environment according to an exemplary embodiment of the disclosure.

Referring now to FIG. 12, illustrative cloud computing environment 1200 is depicted. As shown, cloud computing environment 1200 includes one or more cloud computing nodes 1250 with which local computing devices used by cloud consumers, such as, for example, personal digital assistant (PDA) or cellular telephone 1254A, desktop computer 1254B, laptop computer 1254C, and/or automobile computer system 1254N may communicate. Nodes 1250 may communicate with one another. They may be grouped (not shown) physically or virtually, in one or more networks, such as Private, Community, Public, or Hybrid clouds as described hereinabove, or a combination thereof. This allows cloud computing environment 1200 to offer infrastructure, platforms and/or software as services for which a cloud consumer does not need to maintain resources on a local computing device. It is understood that the types of computing devices 1254A-N shown in FIG. 12 are intended to be illustrative only and that computing nodes 1250 and cloud computing environment 1200 can communicate with any type of computerized device over any type of network and/or network addressable connection (e.g., using a web browser).

Figure 13:
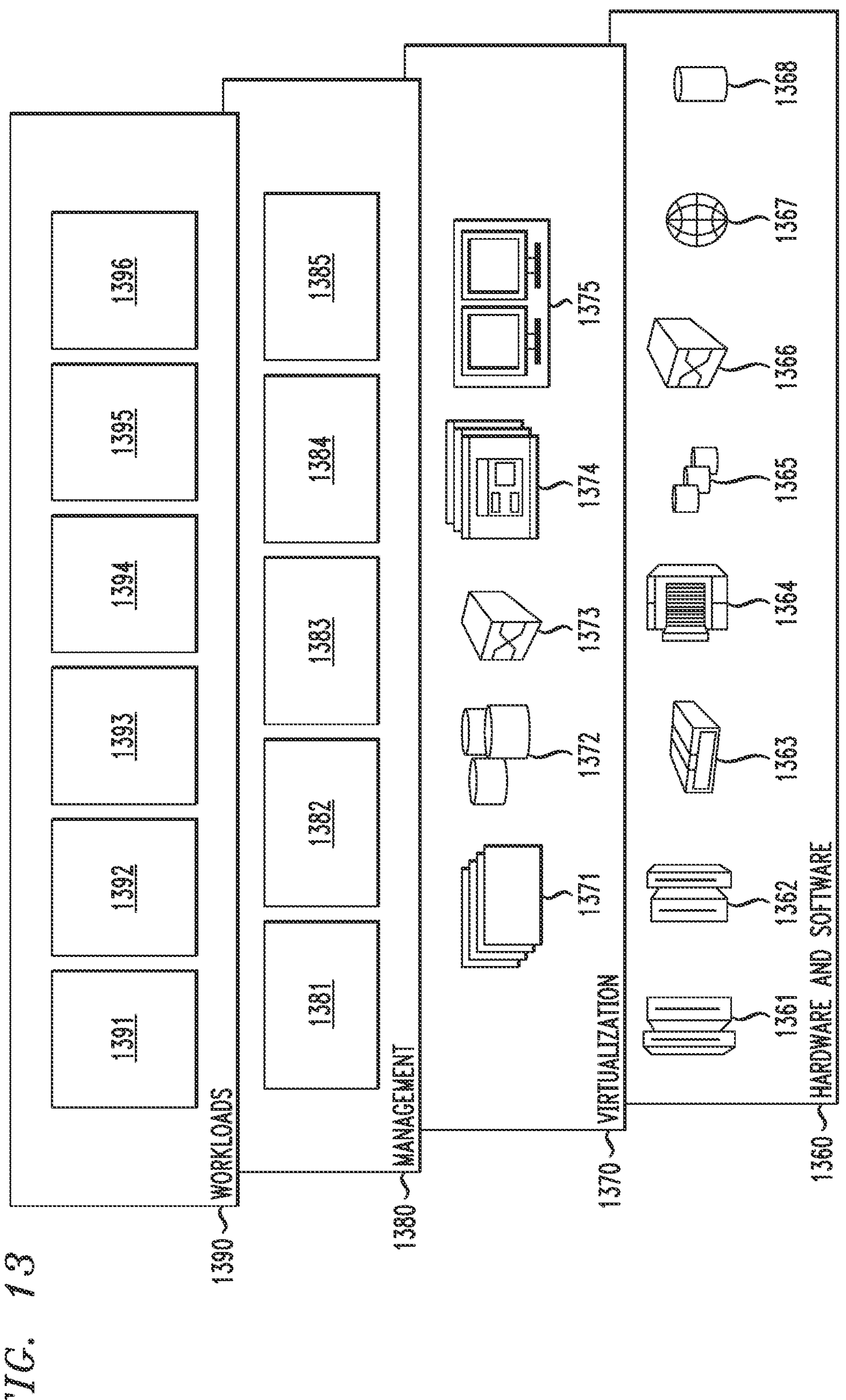
FIG. 13 depicts abstraction model layers according to an exemplary embodiment of the disclosure.

Referring now to FIG. 13, a set of functional abstraction layers provided by cloud computing environment 1200 (FIG. 12) is shown. It should be understood in advance that the components, layers, and functions shown in FIG. 13 are intended to be illustrative only and embodiments of the invention are not limited thereto. As depicted, the following layers and corresponding functions are provided:

Hardware and software layer 1360 includes hardware and software components. Examples of hardware components include: mainframes 1361; RISC (Reduced Instruction Set Computer) architecture based servers 1362; servers 1363; blade servers 1364; storage devices 1365; and networks and networking components 1366. In some embodiments, software components include network application server software 1367 and database software 1368.

Virtualization layer 1370 provides an abstraction layer from which the following examples of virtual entities may be provided: virtual servers 1371; virtual storage 1372; virtual networks 1373, including virtual private networks; virtual applications and operating systems 1374; and virtual clients 1375.

In one example, management layer 1380 may provide the functions described below. Resource provisioning 1381 provides dynamic procurement of computing resources and other resources that are utilized to perform tasks within the cloud computing environment. Metering and Pricing 1382 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1383 provides access to the cloud computing environment for consumers and system administrators. Service level management 1384 provides cloud computing resource allocation and management such that required service levels are met. Service Level Agreement (SLA) planning and fulfillment 1385 provide pre-arrangement for, and procurement of, cloud computing resources for which a future requirement is anticipated in accordance with an SLA.

Workloads layer 1390 provides examples of functionality for which the cloud computing environment may be utilized. Examples of workloads and functions which may be provided from this layer include: mapping and navigation 1391; software development and lifecycle management 1392; virtual classroom education delivery 1393; data analytics processing 1394; transaction processing 1395; and various functions 1396 for performing STDP training of artificial neural networks, as well as inference/classification using STDP-trained neural networks, as discussed above in conjunction with, e.g., FIG. 10. Furthermore, in some embodiments, the hardware and software layer 1360 would include, e.g., the computing system 100 of FIG. 10 to implement or otherwise support the various workloads and functions 1096 for performing STDP training of neural networks, and inference/classification using STDP-trained neural networks, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:

a phase-change element comprising phase-change material having an inverse resistivity characteristic;

a first electrode disposed on a first surface of the phase-change element, wherein the first electrode comprises a first resistive heater element, and a first electrical insulating layer which electrically insulates the first resistive heater element from the first electrode and the phase-change element; and a second electrode disposed on a second surface of the phase-change element, wherein the second electrode comprises a second resistive heater element, and a second electrical insulating layer which electrically insulates the second resistive heater element from the second electrode and the phase-change element.

2. The device of claim 1, wherein the phase-change material comprises an alloy of chromium, germanium, and tellurium, which exhibits the inverse resistivity characteristic of having a resistive crystalline phase and a conductive amorphous phase.

3. The device of claim 1, wherein the phase-change material comprises a conductive amorphous phase which has a rate of crystallization that is a function of temperature.

4. The device of claim 1, wherein the first and second resistive heater elements comprise one of a tantalum nitride material and a hydrogen-doped carbon material.

5. The device of claim 1, wherein the first and second electrical insulating layers comprise one of an alloy of aluminum nitride and an alloy of boron nitride.

6. The device of claim 1, wherein the first and second surfaces of the phase-change element comprise opposite parallel surfaces of the phase-change element, wherein the first and second electrodes have a same geometric footprint and are disposed in alignment to each other on the opposite parallel surfaces of the phase-change element.

7. The device of claim 1, wherein the first and second surfaces of the phase-change element comprise opposite parallel surfaces of the phase-change element, wherein the first and second electrodes have a same geometric footprint and are disposed in alignment with a predefined offset to each other on the opposite parallel surfaces of the phase-change element.

8. The device of claim 1, wherein the first and second surfaces of the phase-change element are angled planar surfaces of the phase-change element.

9. A device, comprising:

an inverse phase-change material element having a resistive crystalline phase and a conductive amorphous phase;

a first electrode disposed on a first surface of the inverse phase-change material element;

a second electrode disposed on a second surface of the inverse phase-change material element;

a first proximity heater embedded in the first electrode;

a second proximity heater embedded in the second electrode;

a first event pulse generator coupled to the first proximity heater; and a second event pulse generator coupled to the second proximity heater;

wherein a time-dependent resistance of the inverse phase-change material element between the first and second electrodes is proportional to a time difference between first and second pulses generated by the respective first and second event pulse generators.

10. The device of claim 9, wherein a memory of the time difference as captured by the time-dependent resistance is tunable by changing a temperature of the inverse phase-change material element.

11. The device of claim 9, wherein the first and second event pulse generators comprise respective first and second sensor devices configured to sense a target event.

12. The device of claim 9, further comprising a correlation signal generator circuit which is configured to apply a read voltage to the first and second electrodes, to receive a read current which flows through the inverse phase-change material element between the first and second electrodes in response to the applied read voltage, and to determine a conductance state of the inverse phase-change material element based on the read current.

13. The device of claim 9, wherein the inverse phase-change material element has a rate of crystallization of the conductive amorphous phase which is a function of temperature.

14. The device of claim 9, wherein the inverse phase-change material element comprises an alloy of chromium, germanium, and tellurium.

15. The device of claim 9, wherein the first and second proximity heaters elements comprise one of a tantalum nitride material and a hydrogen-doped carbon material.

16. The device of claim 9, wherein:

the first electrode comprises a first electrical insulating layer which electrically insulates the first proximity heater from the first electrode and the inverse phase-change material element; and the second electrode comprises a second electrical insulating layer which electrically insulates the second proximity heater from the second electrode and the inverse phase-change material element;

wherein the first and second electrical insulating layers comprise one of an alloy of aluminum nitride and an alloy of boron nitride.

17. A system, comprising:

a neuromorphic system comprising an artificial neural network, wherein the artificial neural network comprises neuron devices, and an array of synaptic devices which connect the neuron devices;

wherein at least one neuron device comprises an inverse phase-change material device, wherein the inverse phase-change material device comprises:

a phase-change element comprising phase-change material having an inverse resistivity characteristic;

a first electrode disposed on a first surface of the phase-change element, wherein the first electrode comprises a first resistive heater element, and a first electrical insulating layer which electrically insulates the first resistive heater element from the first electrode and the phase-change element; and a second electrode disposed on a second surface of the phase-change element, wherein the second electrode comprises a second resistive heater element, and a second electrical insulating layer which electrically insulates the second resistive heater element from the second electrode and the phase-change element.

18. The system of claim 17, wherein the inverse phase-change material device of the at least one neuron device comprises:

a first programing input terminal coupled to the first resistive heater element and configured to receive a first programming signal from a first synaptic device; and a second programming input terminal coupled to the second resistive heater element and configured to receive a second programming signal from second synaptic device.

19. The system of claim 18, wherein the at least one neuron device further comprises:

a correlation signal generator circuit coupled to the first and second electrodes of the inverse phase-change material device, and configured to generate a correlation signal which is indicative of a correlation between first and second programming signals, which are applied to the first and second programming input terminals, based on a conductivity state of the phase-change element which results from the first and second programming signals being applied to the first and second programing input terminals;

wherein the correlation signal generator circuit is configured to apply a read voltage to the first and second electrodes of the inverse phase-change material device, to receive a read current which flows through the phase-change element between the first and second electrodes in response to the applied read voltage, and to determine a conductance state of the inverse phase-change material device based on the read current.

20. The system of claim 17, wherein:

the phase-change material comprises an alloy of chromium, germanium, and tellurium;

the phase-change material has a rate of crystallization of an amorphous phase which is a function of temperature;

the first and second resistive heater elements comprise one of a tantalum nitride material and a hydrogen-doped carbon material; and the first and second electrical insulating layers comprises one of an alloy of aluminum nitride and an alloy of boron nitride.

* * * * *